US008831053B2

(12) United States Patent
Flaig et al.

(10) Patent No.: US 8,831,053 B2
(45) Date of Patent: Sep. 9, 2014

(54) DETERMINING THE DEGRADATION AND/OR EFFICIENCY OF LASER MODULES

(75) Inventors: Rainer Flaig, Eschbronn (DE); Alexander Killi, Trossingen (DE); Martin Liermann, Villingen Schwenningen (DE); Thomas Notheis, Schramberg (DE)

(73) Assignee: Trumpf Laser GmbH + Co. KG, Schramberg (DE)

( * ) Notice: Subject to any disclaimer, the term of this patent is extended or adjusted under 35 U.S.C. 154(b) by 0 days.

(21) Appl. No.: 13/187,848

(22) Filed: Jul. 21, 2011

(65) Prior Publication Data

US 2012/0020382 A1    Jan. 26, 2012

Related U.S. Application Data

(63) Continuation of application No. PCT/EP2010/000103, filed on Jan. 12, 2010.

(30) Foreign Application Priority Data

Jan. 23, 2009    (DE) .......................... 10 2009 005 999

(51) Int. Cl.
| *H01S 3/13* | (2006.01) |
| *H01S 5/00* | (2006.01) |
| *H01S 5/40* | (2006.01) |
| *H01S 3/06* | (2006.01) |
| *G01R 31/26* | (2014.01) |
| *H01S 3/0941* | (2006.01) |

(52) U.S. Cl.
CPC ............. *H01S 5/0021* (2013.01); *H01S 5/4012* (2013.01); *H01S 3/0625* (2013.01); *G01R 31/2635* (2013.01); *H01S 3/0941* (2013.01); *H01S 5/4018* (2013.01); *H01S 3/0604* (2013.01)
USPC ............... 372/29.014; 372/29.01; 372/29.015

(58) Field of Classification Search
CPC ... H01S 5/0014; H01S 5/0021; H01S 5/0028; H01S 5/0035; H01S 5/0042
USPC ............... 372/29.011, 29.015, 29.014, 38.01, 372/38.02, 38.03, 38.07, 38.09
See application file for complete search history.

(56) References Cited

U.S. PATENT DOCUMENTS

| 5,337,323 A | * | 8/1994 | Rokugawa et al. ............. 372/31 |
| 5,594,748 A | * | 1/1997 | Jabr ........................... 372/38.09 |

(Continued)

FOREIGN PATENT DOCUMENTS

| DE | 10209374 A1 | 7/2003 |
| DE | 112004002892 T5 | 10/2007 |

(Continued)

OTHER PUBLICATIONS

Notification of Transmittal of Translation of the International Preliminary Report on Patentability, mailed Aug. 4, 2011, 12 pages.

*Primary Examiner* — Julio J Maldonado
*Assistant Examiner* — Joshua King
(74) *Attorney, Agent, or Firm* — Fish & Richardson P.C.

(57) ABSTRACT

A method for monitoring a laser system including a plurality of laser modules connected in series, there being connected in parallel to each laser module a bypass arrangement for bridging the corresponding laser module, includes determining a first laser power of the laser system with a plurality of laser modules operational; activating the bypass arrangement of at least one laser module so that at least one of the plurality of laser modules is bypassed; determining a second laser power of the laser system with the at least one of the plurality of laser modules bypassed; and monitoring the laser system based on a difference between the first and second laser power.

7 Claims, 3 Drawing Sheets

(56) References Cited

U.S. PATENT DOCUMENTS

| | | |
|---|---|---|
| 6,144,684 A | 11/2000 | McMinn et al. |
| 6,785,310 B2 | 8/2004 | Huber et al. |
| 7,460,571 B2 * | 12/2008 | Hattori ............................ 372/26 |
| 7,701,990 B2 | 4/2010 | Morimoto et al. |
| 2002/0126724 A1 * | 9/2002 | Tsunekane et al. ............. 372/69 |
| 2002/0150139 A1 * | 10/2002 | Koshimae et al. ............. 372/75 |
| 2004/0165629 A1 | 8/2004 | Iwakura |
| 2005/0018726 A1 * | 1/2005 | Dinger et al. ............. 372/38.09 |
| 2007/0160098 A1 * | 7/2007 | Morimoto .................. 372/38.09 |
| 2007/0171947 A1 | 7/2007 | Bell |
| 2008/0253418 A1 * | 10/2008 | Egawa et al. ............. 372/38.02 |
| 2008/0273123 A1 | 11/2008 | Morikawa et al. |

FOREIGN PATENT DOCUMENTS

| | | |
|---|---|---|
| EP | 0955619 A1 | 11/1999 |
| EP | 1481453 A1 | 12/2004 |
| EP | 2034572 A1 | 3/2009 |
| JP | 2001267678 A | 9/2001 |
| JP | 2004014917 A | 1/2004 |
| JP | 2004207420 A | 7/2004 |
| JP | 2004207420 A1 | 7/2004 |
| JP | 2007327753 A | 12/2007 |

\* cited by examiner

DETERMINING THE DEGRADATION AND/OR EFFICIENCY OF LASER MODULES

CROSS-REFERENCE TO RELATED APPLICATIONS

This application is a continuation of and claims priority under 35 U.S.C. §120 to PCT/EP2010/000103, filed on Jan. 12, 2010, and designating the U.S., which claims priority under 35 U.S.C. §119 to German Patent Application No. 10 2009 005 999.7, filed on Jan. 23, 2009. The contents of both the prior applications are hereby incorporated by reference in their entirety.

TECHNICAL FIELD

The disclosure relates to a method for determining the degradation and/or efficiency of laser modules of a laser module arrangement having a plurality of laser modules which are connected in series, there being connected in parallel to each laser module a bypass arrangement, by means of which the associated laser module can be bypassed. Furthermore, the disclosure relates to a laser unit having an electrical power supply to which a plurality of laser modules which are connected in series are connected, each laser module comprising at least one laser diode and a controllable bypass arrangement being associated with each laser module.

BACKGROUND

In order to achieve high power output levels, laser modules should be supplied with high currents. It is therefore advantageous to connect the laser modules in series to an electrical power supply. The current is consequently the same for all laser modules. The voltages are cumulative. However, connection in series can have the disadvantage that, when one module fails, the other modules also fail at the same time.

In some cases, the laser modules may not only fail completely but their power can also be reduced due to degradation to such an extent that they must be replaced. It is therefore advantageous to measure the optical power of the individual modules in order to be able to determine which modules have to be replaced.

There are generally provided to this end current, voltage, temperature and cooling water throughflow measuring devices for the individual laser modules in order to determine the optical power which generally corresponds to the electrical power minus the thermal power. It is consequently possible to determine a degradation of the laser module in a more or less precise manner.

However, the electrical and thermal power measurement of each laser module within a laser system can be very cost-intensive. Without these measuring devices, however, determining the degradation of the individual laser modules without removing them from the laser system may not be possible. Removing individual modules from the laser system for measurement can itself be time and cost-intensive.

SUMMARY

Laser systems and methods are disclosed in which the degradation and/or efficiency of individual laser modules in the laser system can be determined in a cost-effective manner. The determination is made without removing the laser module from the laser system.

In general, in one aspect, the invention features a method for monitoring a laser system including a plurality of laser modules connected in series, there being connected in parallel to each laser module a bypass arrangement for bridging the corresponding laser module, includes determining a first laser power of the laser system with a plurality of laser modules operational; activating the bypass arrangement of at least one laser module so that at least one of the plurality of laser modules is bypassed; determining a second laser power of the laser system with the at least one of the plurality of laser modules bypassed; and monitoring the laser system based on a difference between the first and second laser power.

It is self-evident that these method steps do not necessarily have to be carried out in the sequence set out above. For example, it is also possible to first establish the laser power for a smaller number of laser modules which are connected in series, then to switch on another laser module which had until then been bypassed by the bypass arrangement and subsequently to determine the laser power for this higher number of laser modules and subsequently to establish the difference. Owing to the fact that, for one of the laser power determinations, a laser module or a group of laser modules is bypassed, it is possible to determine the efficiency or degradation of the laser modules from a comparison with the laser power established when these laser modules are not bypassed. The degradation can consequently be determined exclusively on the basis of laser power measurements, regardless of temperature or electrical power measurement. The laser power measurement can be carried out, for example, in an optical manner. In some embodiments, it is possible to determine the degradation and/or the efficiency of the bypassed laser module(s) from the difference of the laser powers.

It is particularly advantageous for the individual laser modules to be bypassed and the laser power to be determined one after the other. Consequently, data is obtained for all laser modules of a laser unit. The degradation of each individual laser module can be identified promptly and the corresponding laser module can be replaced if necessary.

The decrease in laser power can be established for each bypassed laser module and the degradation and/or efficiency of the laser module can be established therefrom.

In some embodiments, there may be provision for the degradation and/or efficiency of each laser module to be established automatically at predetermined intervals. It is, for example, possible to bypass each laser module in order to determine the laser power every two hundred operating hours.

Alternatively, or in addition, there may be provision for the degradation and/or the efficiency of each laser module to be established at the initiation of a user. The laser power is conventionally established continuously for a laser power adjustment. If it can be seen from this that the laser power is decreasing, this is an indication that the efficiency of at least one laser module is decreasing. In order to identify this laser module, it is possible to initiate the determination of the degradation of the laser modules manually.

It is further possible to automatically establish the degradation and/or efficiency of the laser modules in the event of power loss. This process preferably occurs during operational breaks.

It is further advantageous for the degradation and/or efficiency of each laser module to be recorded for the duration of its service life. It is thereby possible to establish statistical data.

In general, in another aspect, the invention features a laser system including multiple laser modules and a control device, via which bypass arrangements can be controlled in order to selectively bypass the laser modules. It is thereby possible to selectively bypass one or more of the laser modules in order to establish the degradation and/or efficiency of this laser module.

In some embodiments, there may be provision for at least one bypass module (e.g., all bypass modules) to have a micro controller. The micro controller may be connected to an electrical power supply and to the control device. The bypass arrangement can be controlled by the micro controller. In particular the micro controller may have a data store (e.g., a memory module). It is possible for the laser system to identify the bypass arrangement by communicating with the micro controller.

At least one bypass module may have an optocoupler or pulse transmitter for controlling a switching element connected in parallel to the corresponding laser module. The switching element may be, for example, a thyristor or include a thyristor. It is also possible to consider other semi-conductor switches, such as MOSFETS, bipolar transistors, etc., as switching elements or components of switching elements. Galvanically separated control of the bypass module is possible, e.g., using an optocoupler.

In certain embodiments, there may be provision for at least one bypass module to have a detector for establishing the malfunction of the associated laser module. If the detector identifies the malfunction of the laser module, the bypass arrangement can be controlled in a selective manner so that the laser module is bypassed and the laser unit remains operational.

The same detector can be used for this purpose or an alternative detector can be provided in order to establish the bypass of the associated laser module.

The control device can be integrated in a control and regulation system of the laser system.

The laser system can include one or more laser units, each including one or more of the laser modules.

Other features and advantages will be appreciated from the following detailed description of embodiments with reference to the Figures and from the claims. The features shown therein are not necessarily intended to be understood to be to scale and are illustrated in such a manner that the specific features can be made clearly visible. The various features can be implemented individually or together in any combination.

Embodiments are illustrated in the schematic drawings and explained in greater detail in the following description.

DETAILED DESCRIPTION

Figure 1:
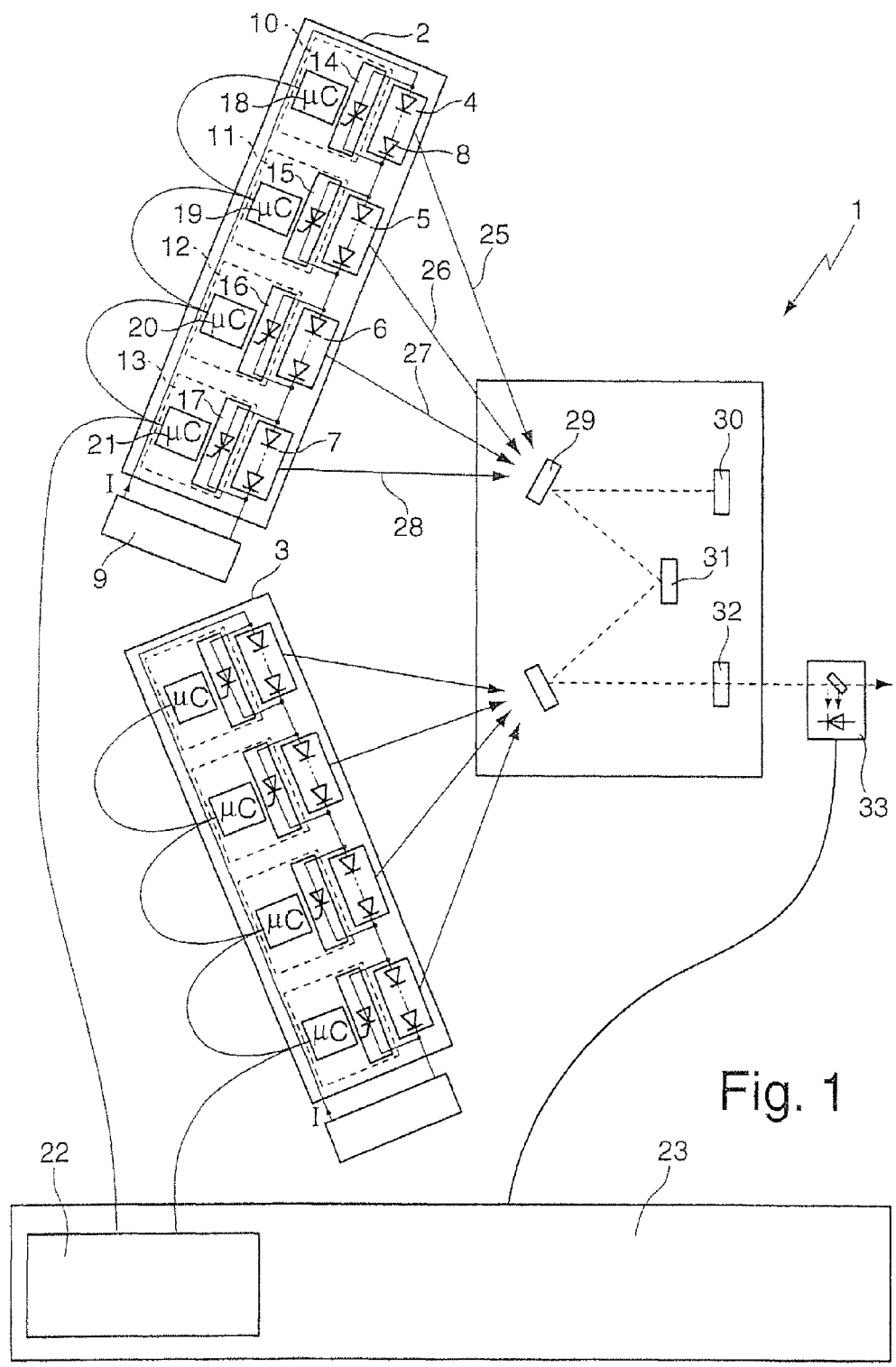
FIG. 1 is a schematic illustration of a disc laser system with two laser units.

FIG. 1 shows a laser system 1 which is constructed as a disc laser and which includes two laser units 2, 3. The laser units 2, 3 are constructed in an identical manner so that only the laser unit 2 is described below.

The laser unit 2 has four laser modules 4-7 which are connected in series. In general, laser units can include fewer or more than four laser modules. Each laser module 4-7 includes one or more laser diodes 8 which are connected in series. The laser modules 4-7 are connected to a common electrical power supply 9 so that the same current flows through all the laser modules 4-7. The voltage drop across each laser module 4-7 may be different. A corresponding bypass arrangement 10-13 is associated with each laser module 4-7. Each bypass arrangement 10-13, when activated, diverts power from the corresponding laser module 4-7 so that the laser module does not produce laser radiation. Activation of each bypass arrangement 10-13 is controlled by switching elements 14-17, which are connected in a conductive manner. Each bypass arrangement 10-13 has a micro controller 18-21. The micro controllers 18-21 of the laser unit 2 are connected to a control device 22 which is an integral component of a control and adjustment system 23. The micro controllers 18-21 can be connected to the control device 22 in parallel or connected to each other in series as illustrated.

The laser units 2, 3 act pump units, the laser modules 4-7 acting as pump modules. Owing to the laser modules 4-7, pump light is produced which is indicated by the arrows 25-28. The pump light excites a laser-active medium 29 and the laser light produced is optionally emitted by a decoupling mirror 32 after redirection by the mirrors 30, 31. The laser light emitted is detected by a power measuring device 33 and transferred to the control and regulation system 23. The laser power measured can be used on the one hand for controlling the laser power and on the other hand for determining the degradation and/or efficiency of individual laser modules 4-7. The efficiency of a laser module refers to the ratio of the laser power output from the module to its input power. Degradation refers to the change (typically a reduction) of the module's efficiency over time.

In order to determine the degradation and/or efficiency of a laser module 4-7, the laser power of laser system 1 can first be established if all the laser modules 4-7 are active, that is to say, are not bypassed by a switching element 14-17. Subsequently, one of the laser modules 4-7 can be selectively bypassed by a switching element 14-17 so that pump light is produced by a second, smaller number of laser modules 4-7. The laser power of laser system 1 is also measured for this state. By comparing the two laser powers established it is possible to derive the degradation and/or efficiency of the bypassed laser module 4-7.

When a thyristor is used as a switching element, the module bypass is actuated by the electrical power supply being briefly switched off using the control unit 22 so as to fall below the holding current of the thyristor.

Figure 2:
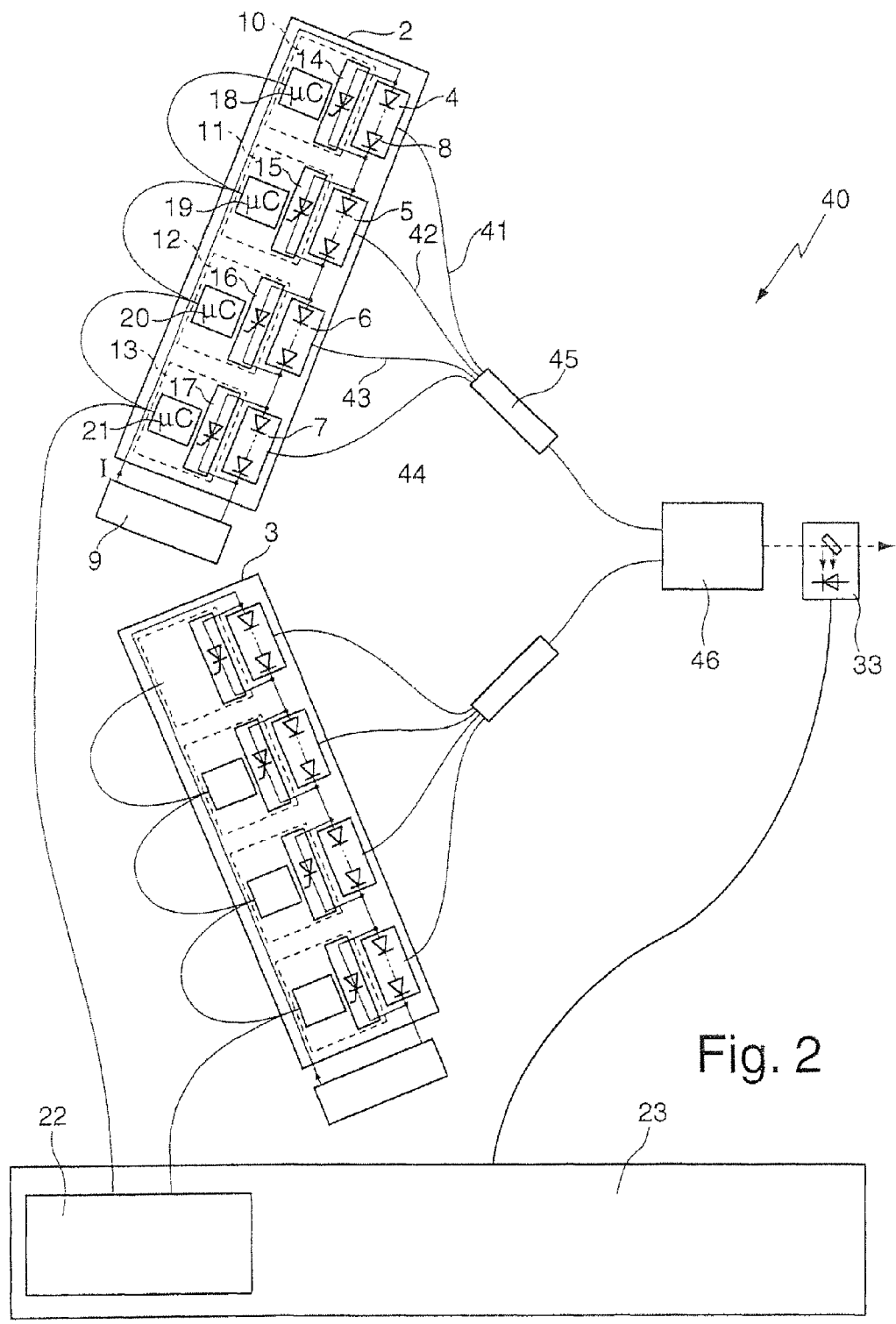
FIG. 2 is a schematic illustration of a diode laser system with two laser units.

FIG. 2 illustrates a laser system 40 which is constructed as a diode laser system. The laser units 2, 3 correspond to those of the previous embodiment. The laser light produced by the laser diodes 8 is supplied to a combiner 45 via fibers 41-44. In a combiner 46, the laser light produced by the two laser units 2, 3 is coupled and subsequently emitted. The laser power is again detected by a measuring device 33.

The measuring device can be located at the output of the laser system as shown in FIG. 2. Alternatively, or additionally, measuring devices can be positioned after each laser module 4-7, e.g., prior to combiner 45.

Figure 3:
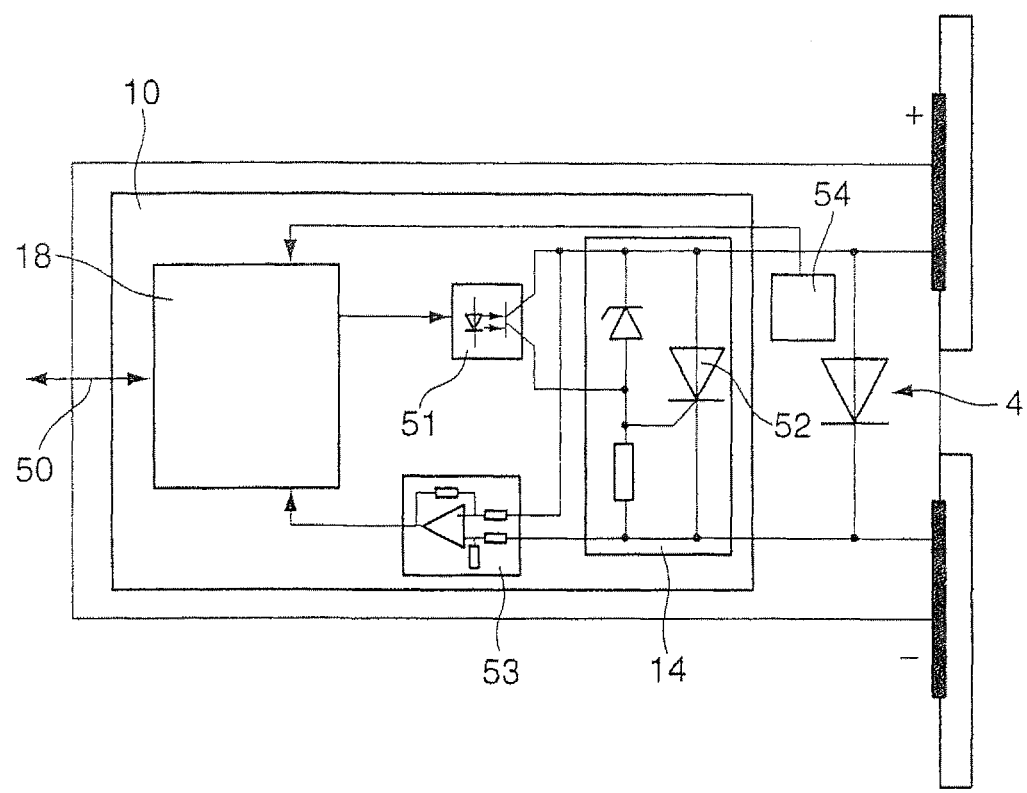
FIG. 3 is a schematic illustration of a bypass arrangement.

FIG. 3 illustrates an exemplary embodiment of a bypass arrangement 10 in greater detail. The micro controller 18 of the bypass arrangement 10 is connected to a voltage supply and the control unit 22 via an interface 50. The micro controller 18 includes a data store (e.g., a memory module). In order to selectively switch off the associated laser module 4, that is, the switching element 14 being switched to a conductive state, an optocoupler 51 is provided which can be controlled by the micro controller 18. In the embodiment illustrated, the switching element 14 comprises a thyristor 52.

A detector 53 is connected to the switching element 14, in particular for measuring voltage. The laser system can identify whether a selective bypass operation has taken place via the microcontroller 18 of the laser module 4 based on the measured voltage. An erosion protection 54 is also provided and is connected to the microcontroller 18.

A number of embodiments have been described. Nevertheless, it will be understood that various modifications may be made without departing from the spirit and scope of the invention. Accordingly, other embodiments are within the scope of the following claims.

What is claimed is:

1. A method for monitoring a laser system comprising a plurality of laser modules connected in series, there being connected in parallel to each laser module a bypass arrangement for bridging the corresponding laser module, the method comprising:
   a. determining a first laser power of the laser system with two or more laser modules of the plurality of laser modules operational;
   b. activating the bypass arrangement of at least one operational laser module so that at least one of the operational laser modules is bypassed;
   c. determining a second laser power of the laser system with the at least one operational laser module bypassed;
   d. monitoring the laser system based on a variation between the first and second laser powers, wherein monitoring the laser system comprises determining a degradation and/or efficiency of the at least one bypassed laser module based on the variation between the first and second laser powers; and
   e. deactivating the activated bypass arrangement of the at least one bypassed laser module to switch the at least one bypassed laser module back on.

2. The method of claim 1 wherein the laser system comprises one or more laser units, each laser unit comprising a plurality of laser modules.

3. The method of claim 1 wherein each of the plurality of laser modules is bypassed one after the other and a laser power of the laser system is measured while each laser module is bypassed.

4. The method of claim 3 wherein a decrease in laser power of the laser system is established for each bypassed laser module and the degradation and/or efficiency of the laser module is established therefrom.

5. The method of claim 1 wherein the degradation and/or efficiency of each laser module is automatically established at predetermined intervals.

6. The method of claim 1 wherein the degradation and/or the efficiency of one or more of the laser modules is established at the initiation of a user or the degradation and/or efficiency of one or more of the laser modules is established automatically responsive to a decrease of the laser power of the laser system.

7. The method of claim 1 wherein the degradation and/or efficiency of each laser module is recorded over a service life of the corresponding laser module.

\* \* \* \* \*